United States Patent [19]
Aine

[11] Patent Number: 5,000,817
[45] Date of Patent: Mar. 19, 1991

[54] BATCH METHOD OF MAKING MINIATURE STRUCTURES ASSEMBLED IN WAFER FORM

[76] Inventor: Harry E. Aine, Rte. 4, Box 767, Sumrall, Miss. 39482

[21] Appl. No.: 145,465

[22] Filed: Jan. 19, 1988

Related U.S. Application Data

[60] Division of Ser. No. 875,598, Jun. 18, 1986, Pat. No. 4,732,647, which is a continuation-in-part of Ser. No. 664,475, Oct. 24, 1984, abandoned.

[51] Int. Cl.⁵ .................... H01L 21/306; B44C 1/22; C03C 15/00; C03C 25/06
[52] U.S. Cl. .................... 156/633; 73/517 R; 156/647; 156/651; 156/653; 156/657; 156/659.1; 156/662; 338/46
[58] Field of Search ............ 156/647, 653, 657, 659.1, 156/662, 629, 633, 651; 437/921, 209, 226, 227, 228, 225; 338/2, 4, 42, 47, 46; 267/161; 73/510, 517 R; 357/26, 55; 29/621.1

[56] References Cited

U.S. PATENT DOCUMENTS

| | | | |
|---|---|---|---|
| 2,767,973 | 10/1956 | Ter Veen et al. | 267/161 X |
| 3,506,424 | 4/1970 | Pomerantz | 156/273.9 X |
| 4,144,516 | 3/1979 | Aine | 29/580 X |
| 4,224,101 | 9/1980 | Tijburg et al. | 156/643 |
| 4,323,994 | 4/1982 | Coogler | 267/161 X |
| 4,342,227 | 8/1982 | Petersen et al. | 73/517 R X |
| 4,400,861 | 8/1983 | Parker | 267/161 X |
| 4,472,239 | 9/1984 | Johnson et al. | 156/647 |
| 4,553,436 | 11/1985 | Hannsson | 73/517 R |

OTHER PUBLICATIONS

Peterson, Kurt, "Dynamic Micromechanics on Silicon . . ", IEEE Trans. on Elect. Devices, vol. ED-25, No. 10, Oct. 1978, pp. 1241-1250.

Roylance, Lynn, "A Batch-Fabricated Silicon Accelerometer", IEEE Trans. on Elect. Devices, vol. ED-26, No. 12, Dec. 1979, pp. 1911-1917.

Primary Examiner—William A. Powell
Attorney, Agent, or Firm—Harry E. Aine

[57] ABSTRACT

A batch method for fabricating semiconductor capacitive force transducers is disclosed wherein a first wafer of silicon or fused silica is recessed by etching to define an array of force transducer structures, each including a deflectable portion supported from a surrounding frame portion. The first wafer is thermoelectrically bonded between a pair of glass or quartz plates, each plate having an array of electrode structures for capacitively sensing deflection of the individual force transducers. Each electrode structure includes a lead portion passing over the frame portion of the transducers and being spaced from the frame to provide a gas communication passageway through the frame to the capacitive gap between the electrode structure and the deflectable portion of each transducer. The composite assembled wafers are notched along cleave lines generally outlining the individual transducer structures. The notching along the cleave lines is preferably performed by sawing or scribing with the saw kerf or scribe lines extending only partially through the plates so as not to contaminate the individual transducer devices. The individual transducer structures are then cleaved from the composite wafer so as not to introduce contaminants into the individual transducers.

18 Claims, 5 Drawing Sheets

Fig_14  Fig_15

Fig_16

Fig_32

Fig_33  Fig_34

Fig_17

Fig_18

Fig_19

Fig_20

Fig_21

Fig_22

Fig_23

Fig_24

Fig_25

Fig_26

Fig_27

Fig_28

Fig_29

Fig_30

Fig_31

BATCH METHOD OF MAKING MINIATURE STRUCTURES ASSEMBLED IN WAFER FORM

RELATED CASES

The present invention is a divisional application of U.S. Ser. No. 875,598 filed 18 June 1986, now issued U.S. Pat. No. 4,732,647 on 22 Mar. 1988 which in turn is a continuation-in-part of co-pending U.S. Ser. No. 664,475 filed 24 Oct. 1984, now abandoned.

BACKGROUND OF THE INVENTION

The present invention relates in general to a batch method for making miniature capacitive force transducers assembled in wafer form and, more particularly, to such methods wherein the individual force transducers are not hermetically sealed and are cleaved from a composite wafer structure to provide batches of individual transducer die.

DESCRIPTION OF THE PRIOR ART

Heretofore, batch methods of fabricating hermetically sealed individual force transducers assembled in wafer form have been proposed wherein the individual silicon force transducers have comprised deflectable units, such as a sensing mass, supported from a surrounding frame via the intermediary of a cantilever beam on which was embedded a piezoresistive sensor. A wafer containing an array of such transducers was thermoelectrically bonded inbetween a pair of glass wafers for hermetically sealing each of the transducer devices. The composite wafer sandwich was then diced by sawing. In one case, the glass wafer portions were sawn through to the silicon wafer and then a thin web portion of the silicon wafer was cracked for separation of the individual die. In another case, the composite wafer sandwich was sawn completely through to separate the individual die.

Such a batch method of fabrication is disclosed in an article appearing in the IEEE Transactions On Electron Devices, Vol. ED-26, No. 12 (December 1979), pgs. 1910-1917. Also, this method is disclosed in a Ph.D. dissertation of L. M. Roylance entitled: "A Miniature Integrated Circuit Accelerometer for BioMedical Applications", Department of Electrical Engineering, Stanford University, Stanford, Calif., 1977, pgs. 17-46.

While such a prior method is suitable for batch fabrication of hermetically sealed individual transducers, it is not suitable for fabrication of transducers that are not hermetically sealed since the sawing operation will introduce contamination into the unsealed devices. In the case of a capacitive force transducer, the spacings between the deflectable element and the spaced electrode is typically so close, i.e., on the order of 1-4 microns that even the slightest particulate contamination will render the devices inoperable.

Undercut anisotropic etching of various silicon structures is described and claimed in my co-pending U.S. Patent applications Ser. Nos.: 556,832 filed 1 Dec. 1983, U.S. Pat. No. 4,597,003; 568,740 filed 6 Jan. 1984, now abandoned, and, 556,833 filed 1 Dec. 1983, U.S. Pat. No. 4,600,934.

Thus, it is desired to provide an improved method for batch fabrication of miniature capacitive force transducers assembled in wafer form and which are not hermetically sealed.

SUMMARY OF THE PRESENT INVENTION

The principal obJect of the present invention is the provision of an improved batch method of making miniature capacitive force transducers assembled in wafer form.

In one feature of the present invention, a wafer is recessed in a pre-determined pattern to produce an array of deflectable force transducers in the wafer, a second wafer having a patterned, metallized surface defines thereon an array of capacitive electrodes for capacitively detecting displacement of the force transducer units. Each metallized electrode pattern for each transducer device includes a lead portion passing over a frame portion of the individual force transducer units in spaced relation to provide a gas communication passageway between the interior of the deflectable force transducer unit and the exterior of the unit when separated from the wafer. The first and second wafers are bonded together in mutually opposed aligned relationship and the material is removed from the second wafer along certain cleave lines generally outlining the individual ones of the transducer units with the removed material extending only partially through the thickness of the second wafer. The individual transducer devices are then cleaved along the cleave lines to separate the individual force transducers, one from the other, whereby particulate contamination is not introduced into the unsealed units through the gas communication passageway.

In another feature of the present invention, the first wafer which is recessed to define the array of force transducer units is sandwiched between a pair of outside wafers, each of the outside wafers includes the array of capacitive electrode structures and leads passing through gas communication passageways between the frame and outside wafer portions of each of the transducer units and wherein both of the outside wafers of the composite wafer structure are notched as by scribing or sawing along the cleave lines.

In another feature of the present invention, the recessed wafer defining the deflectable force transducer units is made of a diamond cubic semiconductive material which is thermoelectrically bonded inbetween glass wafers having the capacitive electrode patterns formed thereon.

In another feature of the present invention, the frame portions for the individual transducer units include tab portions which extend outwardly from the frame and either the tab is coated or the opposed surface of the electrode bearing and overlaying wafer is coated or the tab and overlaying wafer are spaced apart in such a manner to prevent bonding of the tab portion to the overlaying wafer and the overlaying electrode-bearing wafer is notched along certain cleave lines for cleaving the non-bonded portion of the electrode-bearing wafer from the tab to expose the underlying tab portion to facilitate making electrical contact to the frame portion of the force transducer units.

Other features and advantages of the present invention will become apparent upon a perusal of the following specification taken in connection with the accompanying drawings wherein:

DESCRIPTION OF THE PREFERRED EMBODIMENTS

Figures 1, 3:
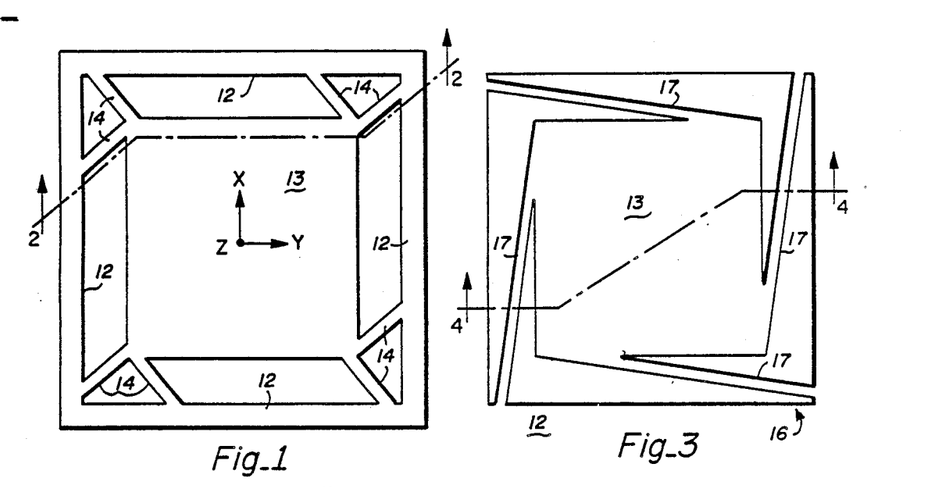
FIG. 1 is a plan view of a parallel transport structure incorporating features of the present invention.
FIG. 3 is a plan view similar to that of FIG. 1 depicting an alternative parallel transport structure.
Figure 2:
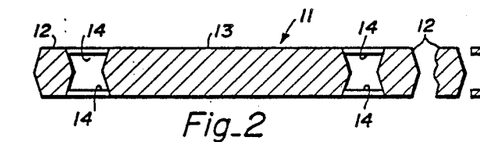
FIG. 2 is a cross-sectional view of the structure of FIG. 1 taken along the line 2—2 in the direction of the arrows.

Referring now to FIGS. 1 and 2, there is shown, in plan and cross-sectional view, a parallel transport structure 11 incorporating features of the present invention. The parallel transport structure 11 includes a surrounding rectangular frame member 12 with a central parallel transport structure 13 suspended from the frame 12 via the intermediary of sixteen legs 14. The legs 14 do not extend directly from the central parallel transport structure 13 to the closest point of the surrounding frame 12 but instead extend away from the central parallel transport structure 13 with a component directed circumferentially of its axis of parallel transport which axis is perpendicular to the plane of the frame 12 (Z axis). All of the legs 14 extend away from the central parallel transport structure 13 with the same sense of rotation about the axis of parallel transport such that axial movement of the central parallel transport structure 13 is accompanied by a slight rotation of the central parallel transport structure about its axis of translation. This allows a relatively large axial translation for a given amount of stress in the support legs 14 and permits the central parallel transport structure 13 to move axially in such a manner that its two major faces remain parallel to the plane of the frame 12.

The frame, suspension legs 14 and central parallel transport structure 13 are formed in a single etching step by anisotropic ally etching a wafer of diamond cubic material from both sides simultaneously. More particularly, both major faces of the wafer are provided with a relatively thin layer of etch stop material, i.e., a material which is etched at a much slower rate than that of the bulk wafer material. For example, such etch stop layers may be formed by diffusing into both major faces of the wafer, impurities of P type dopant such as boron to a concentration greater than $5 \times 10^{19}$ per cubic centimeter which, in the case of a P type bulk wafer material, will serve as a concentration etch stop for certain anisotropic etchants such as ethylene diamine pyrocatechol (EDP). As an alternative, an oxide layer may be grown on opposite major faces of the wafer. Such a layer may be grown by oxidizing the wafer or by depositing an oxide ($SiO_2$) or nitride ($Si_3N_4$) thereon. Oxide serves as an excellent etch stop material for EDP.

In a preferred embodiment, the etch stopped layers on both major faces of the wafer are formed by diffusing or growing epitaxy layers of opposite conductivity type to that of the bulk wafer material. For example, in a case of (100) bulk wafer of P type material with a resistivity of 1-10 ohm centimeters, N type epitaxial layers as of 2-25 is thick and of a resistivity on the order of 1-10 ohm centimeters are grown on opposite faces to provide PN junctions between the N etch stopped layers and the P type substrate. This type of etch stop layer is particularly useful when employing anisotropic etchants selected from the group consisting of hydroxides, of sodium, potassium, lithium and rubidium. The etching is typically carried out at elevated temperatures as of 85° C. while electrically passivating the etch stop layers with an applied potential of 0.6 V as taught by U.S. Pat. No. 3,689,389.

The etch stop layers are masked with a suitable masking material such as Zr, TiW, Au and the etch stopped layers are opened to expose the underlying bulk semiconductive material in accordance with the pattern as shown in FIG. 1. Thereafter, the wafer is etched in the anisotropic etchant with the etch stop in operation so that the etchant attacks and removes the bulk semiconductive material of the wafer and undercut etches the respective legs 14. The legs are inclined at a suitable angle to the traces of the [111] planes of the crystal material on the (100) planes at both major faces of the wafer so that the etchant will undercut etch the respective legs 14. On the other hand, the frame sides and side edges of the central parallel transport structure 13 are preferably aligned with the traces of the [111] planes on the major (100) planes of the wafer so that substantially no undercutting is obtained of the frame 12 and of the central parallel transport structure 13. It is found that when the recesses, which are being etched, receed to the point where they intersect near the midplane of the wafer, that the undercut etching of the legs will be complete and the etching can be terminated at that point to produce the resultant structures of FIGS. 1 and 2.

Referring now to FIGS. 3 and 1, there is shown a parallel transport structure 16 similar to that of FIGS. 1 and 2 with the exception that there are only eight suspension legs 17 instead of the sixteen legs of parallel transport structure 11. The parallel transport structure 16 provides greater axial translation for a given force than the similar parallel transport structure 11 of FIGS. 1 and 2. However, it is less resistant to cross axis shock and vibration than structure 11 of FIGS. 1 and 2. Also, in the case of parallel transport structure 16, there is some tendency to produce rounding of the external corners of the central parallel transport structure 13.

Figure 4:
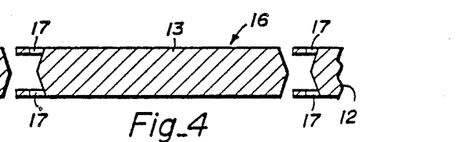
FIG. 4 is a transverse sectional view of the structure of FIG. 3 taken along line 4—4 in the direction of the arrows.
Figure 5:
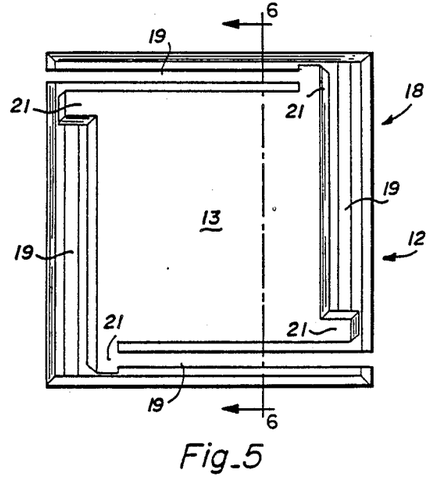
FIG. 5 is a plan view similar to that of FIG. 3 depicting an alternative parallel transport structure incorporating features of the present invention.
Figure 6:
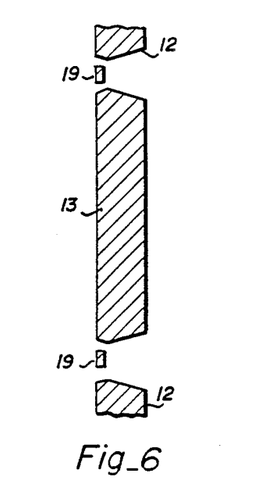
FIG. 6 is a transverse sectional view of the structure of FIG. 5 taken along the line 6—6 in the direction of the arrows.

Referring now to FIGS. 5 and 6, there is shown an alternative parallel transport structure 18 of the present invention. The embodiment of FIGS. 5 and 6 is similar to that of FIGS. 3 and 4 with the exception that the central parallel transport structure 13 is suspended from its surrounding frame structure 12 via the intermediary of only four legs 19 instead of eight legs 17. In addition, legs 19 extend parallel to the inside edges of the frame 12 and to the outer side edges of the central parallel transport structure 13. The legs 19 are primarily undercut by etching recesses from the opposite side of the wafer. The ends of the legs are connected to the central parallel transport structure via the intermediary of rectangular boss portions 21. There will be some tendency for the external corners of the boss portions 21 to be rounded by external corner undercutting, however, this tendency can be minimized when utilizing hydroxide anisotropic etchants by saturating the etching solution with alcohols such as butanol or 1-propanol.

As an alternative to the structures of FIGS. 5 and 6, the suspension legs 19 could comprise eight in number as found in the embodiment of FIGS. 3 and 4, however, in this case, the suspension legs 19 would then be undercut by external corner undercutting beginning with the external corners of the bosses 21. Each suspension leg 19 would be totally undercut upon termination of the etch but this would also provide a substantial amount of rounding and undercutting of the external corners of the parallel transport structure 13.

The advantage to the parallel transport structure 18 of FIGS. 5 and 6 is that the suspension legs 19 flex in a pure bending mode resulting in a substantially greater deflection of the parallel transport structure 13 along its axis of translation for a given force when compared with the structures of FIGS. 1-4.

Also, the parallel transport structures of FIGS. 1-6 are not limited to fabrication by undercut etching of diamond cubic crystalline material but may advantageously be fabricated of fused silica (quartz) which has a much greater strength than that of silicon and other diamond cubic crystalline materials. In the case of a fused silica wafer, both major faces of the fused silica wafer are masked with a suitable etch resistant material such as Cr (500 Å) and Au (10 $\mu$) and etched with a suitable etchant such as 30% $HNO_3$+70% HF+0.030% surfactant FC 99, available from Minnesota Mining and Manufacturing Inc., at 25° C. The etch mask is patterned to expose the fused silica in rectangular regions on the opposite faces of the wafer from the respective leg 14, 17 or 19 to be formed and in narrow areas at the end of each of the bosses 21. The etch is timed to stop short of etching through the wafer so as to have a thin fused silica membrane at the bottom of each of the recesses, which membrane is to form the leg portions 14, 17 or 19. Then, the mask metal is removed, the wafer recoated on opposite sides and photomasked to expose the fused silica at the bottom of narrow slots in the mask which define the marginal side edges of the legs 14, 17 or 19 and the ends of the bosses 21. The wafer is then plasma etched to slot the membranes defining the legs 11, 17 or 19 and to free the ends of the bosses 21 from the frame 12. The resultant parallel transport structures 18 are then metallized and bonded, as by epoxy or brazing metal, inbetween a pair of fused silica plates bearing electrodes, in a manner more fully described below with regard to FIGS. 12 and 13.

Figure 7:
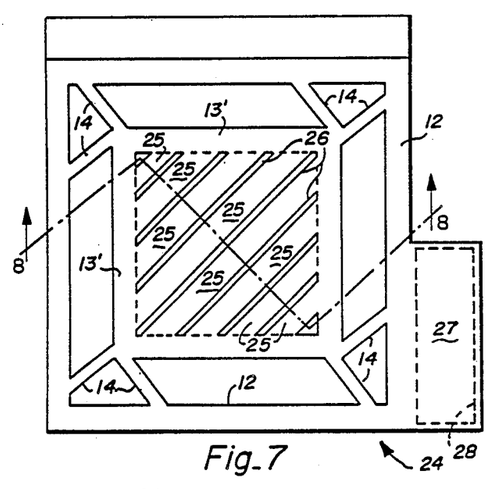
FIG. 7 is a plan view of an alternative parallel transport structure similar to that of FIG. 1 depicting features of the present invention.
Figure 8:
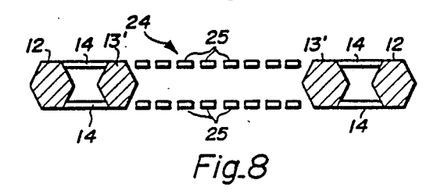
FIG. 8 is a transverse sectional view of the structure of FIG. 7 taken along the line 8—8 in the direction of the arrows.

Referring now to FIGS. 7 and 8, there is shown an alternative parallel transport structure 21 incorporating features of the present invention. The parallel transport structure 24 is essentially the same as 11 of FIGS. 1 and 2 with the exception that the central parallel transport structure 13' is undercut etched to provide a solid ring portion 13' with the central region of the ring 13' being covered on both sides by means of bridging structures 25.

The bridging structures 25 are formed by slotting through the etch stopped layers on opposite major faces of the wafer and introducing the etchant through the slots 26 to undercut etch the out the center of the parallel transport structure 13'. The slots 26 are directed at a substantial angle, as of 45°, to the traces of the [111] planes on the (100) faces so that the bulk wafer material will be etched from inbetween the two slotted etch stopped layers.

In the case of an accelerometer, the central parallel transport structure 13' comprises the sensing mass and hollowing out the sensing mass, as shown in the embodiment of FIGS. 7 and 8, provides a means for changing the G-range of the accelerometer without appreciably changing the geometry of the accelerometer, i.e., the number, length and thickness of the legs 11 and the overall size of the central parallel transport structure 13. A change in G-range is effected by merely changing the mass of the central parallel transport structure 13. If the G range were to be changed by stiffening the legs 14 by making them thicker, the restoring voltage required to electrostatically force the sensing mass 13 back to its null position would be substantially increased as by, for example, a factor of three for a given electrostatic gap spacing between the parallel transport structure 13' and an opposed electrode. However, by changing the mass by a factor of 10, i.e., by reducing the mass by a factor of 10, the same original voltage may be employed for nulling the 10 times increase in gravitational force. The slots would not appreciably reduce the mutually opposed capacitive area between the central parallel transport structure 13' and the opposed electrode.

Another feature of the parallel transport structure 21 of FIGS and 8 is an outwardly directed tab portion 27 of the frame 12. This tab portion 27, in the case where the etch stopped layer has a different type conductivity than that of the bulk material, is further doped in the region bounded by line 28 on opposite sides of the tab 27 to provide an N+ or P+ region for making ohmic contact to the etch stopped layer. In the case 1 of an N doped layer, region 28 is preferably doped to an N+ concentration then metallized with a suitable metal, as of aluminum, to facilitate making ohmic contact to the etch stopped layer.

Figure 9:
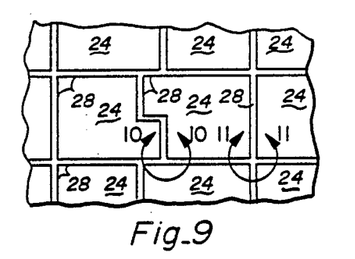
FIG. 9 is a plan view of a portion of a wafer showing an array of parallel transport structures of the present invention.
Figures 10, 11:
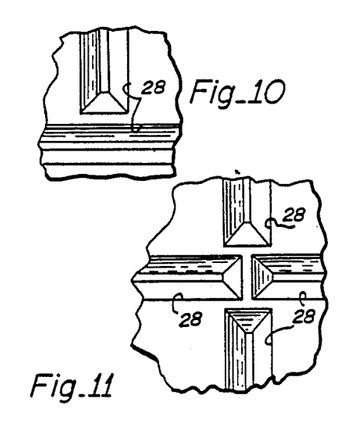
FIG. 10 is an enlarged detailed view of a portion of the structure of FIG. 9 delineated by line 10—10.
FIG. 11 is an enlarged detailed view of a portion of the structure of FIG. 9 delineated by line 11 11.

Referring now to FIGS. 9-11, there is shown, in greater detail, a method for etching the outer boundaries of the individual parallel transport structures 24 to facilitate cleaving of the individual structures 24 from a wafer containing an array of such devices. More particularly, the outer periphery of the parallel transport structures 21 are defined by narrow non-intersecting slots 28 etched through the etch stopped layer and which are aligned with their longitudinal axes parallel to the traces of the [111] planes on the major (100) faces of the wafer.

Slots 28 in the major faces are disposed in vertical registration one above the other on opposite faces of the wafer such that when the wafer is etched, the etchant causes the bottom of the slots to intersect in the midplane of the wafer. The unetched portions at the ends of the slots 28 allows, in the case of an electrical etch stop, the electrical potential to be applied and to extend into each of the etch stopped regions of the individual parallel transport structures 24 so as not to interfere with the electrical etch stop process. The etch stop potential, in such a case, is applied to the outer surface of the etch stopped layer by means of suitable metallization such as 1,000 Å of zirconium, 500 Å of TiW capped off by three microns of gold. In a typical example of a 15 mil thick (100) silicon wafer, the slots 28 have a width as of 12 mils and their ends are spaced one from the other by a distance of approximately two mils at the major faces of the wafer. This leaves an interconnecting wafer structure that allows the individual parallel transport structures to be retained in wafer form but to be readily separated by cleaving, when desired.

Figure 12:
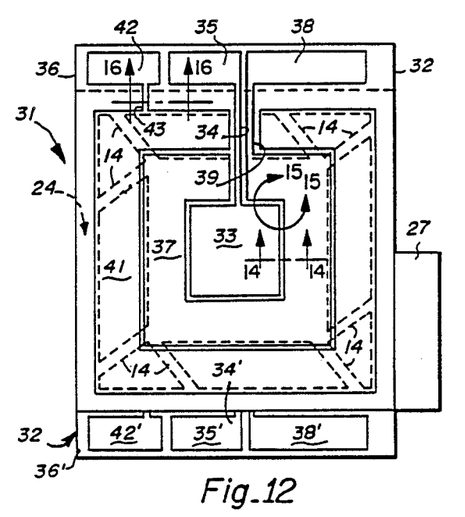
FIG. 12 is a plan view of an accelerometer structure incorporating a parallel transport structure of the present invention.
Figure 13:
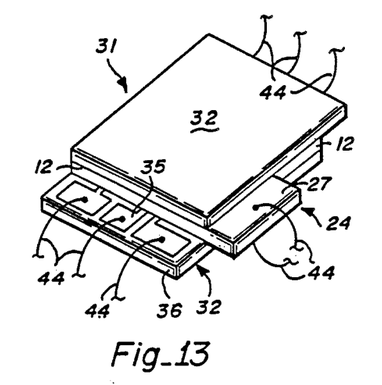
FIG. 13 is a perspective view of the accelerometer structure of FIG. 12.

Referring now to FIGS. 12 and 13, there is shown an accelerometer 31 incorporating features of the present invention. In the accelerometer 31, parallel transport structure 24 is sandwiched inbetween a pair of dielectric plates 32 as of Pyrex glass bearing plate-shaped electrodes on the major faces thereof overlaying the parallel transport structure 24.

The plates 32 each include a central or feedback electrode 33 disposed on the axis of parallel transport and occupying the central region of the parallel transport structure 13. The feedback electrode 33 is formed by metallizing the inside surface of the Pyrex plate 32 and patterning the metal to define the electrode 33 and a lead portion 34 extending out to a contact pad portion 35 disposed on an end portion 36 of the dielectric late 32, which overhangs the edge of the parallel transport frame 12. Similarly, the other dielectric plate 32 includes a similar feedback electrode 33' connected via lead portion 34' to a bonding pad 35' on the overhanging portion 36' of the plate 32. A ring-shaped RF sensing electrode 37 is disposed surrounding the feedback electrode 33 and is electrically connected to a sensing pad 38 via the intermediary of lead portion 39. A ground plane electrode 41 surrounds both the feedback and RF sensing electrodes 33 and 37 and is connected to a ground plane contact pad 12 on the overhanging portion 36 via the intermediary of lead portion 43. The Pyrex plates (#7710) 32 are thermoelectrically bonded to opposite major faces of the frame portions 12 of the parallel transport structures 24 by heating the assembly to 425° C. and applying a negative potential of 500V to the glass 32 relative to the silicon frame 12.

The tab portion 27 of the parallel transport structure 24 projects out over the marginal edges of both dielectric plates 32 to facilitate making electrical contact to the parallel transport structure 21. Leads 44 make electrical contact to the various contact pads of the accelerometer 31. In operation, the parallel transport structure 21 forms the center electrode of a differential capacitor formed by sensing electrodes 37 and 37'. The output of the differential capacitor is amplified and a d.c. output signal is derived based upon the amplitude of the unbalance signal which is thence fedback via a steering circuit to the correct feedback electrode 33 or 33' to electrostatically force the parallel transport structure 13 back to a null position of the differential capacitor. The magnitude of the feedback signal is a measure of the force of acceleration on the parallel transport structure 13.

Figure 14:
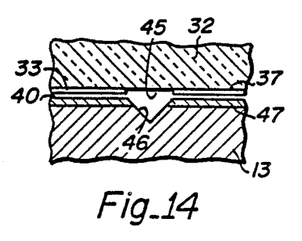
FIG. 14 is an enlarged sectional view of a portion of the structure of FIG. 12 taken along line 14—14 in the direction of the arrows.

Referring now to FIG. 14, there is shown, in cross-sectional view, a portion of the dielectric plate 32 and its electrodes 33 and 37 and the central parallel transport structure 13 spaced away by the capacitive gap 40. The annular space or gap 45 between the feedback electrode 33 and its surrounding sensing electrode 37 provides an exposed region 45 of the Pyrex plate 32, which, during the thermoelectric bond, produces a substantial pulling force on the parallel transport structure 13 causing it to come into very closely spaced relation to the glass at 45. In such a case, under the proper conditions, it would be possible to obtain a thermoelectric bond between the central parallel transport structure 13 and the dielectric plate 32. Thus, in the region of the parallel transport structure 13, opposite the exposed region 45 of the glass, the parallel transport structure is recessed by a self-terminating elongated V-shaped groove or recess at 46 such recess 46 having a width approximately equal to that of the gap 45 between the electrodes 33 and 37. Recess 46 is made by etching through the etch stopped layer 47, then, performing the anisotropic etch of the structure 13. The recess 46 is self-terminating in depth as it is defined by the intersection of the (111) planes.

Figure 15:
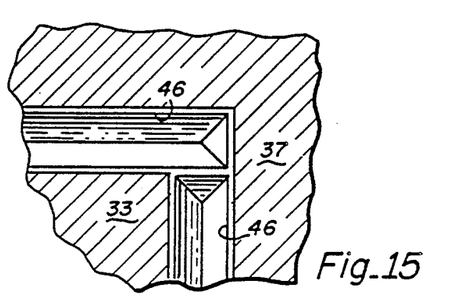
FIG. 15 is an enlarged detailed view of a portion of the structure of FIG. 12 delineated by line 15—15.

Referring now to FIG. 15, as in the non-intersecting slots 28 of FIGS. 9-11, the slots 46 do not intersect at their corners to prevent external corner etching which would otherwise be encountered if the slots 46 were actually to intersect.

Figures 16, 32, 33, 34:
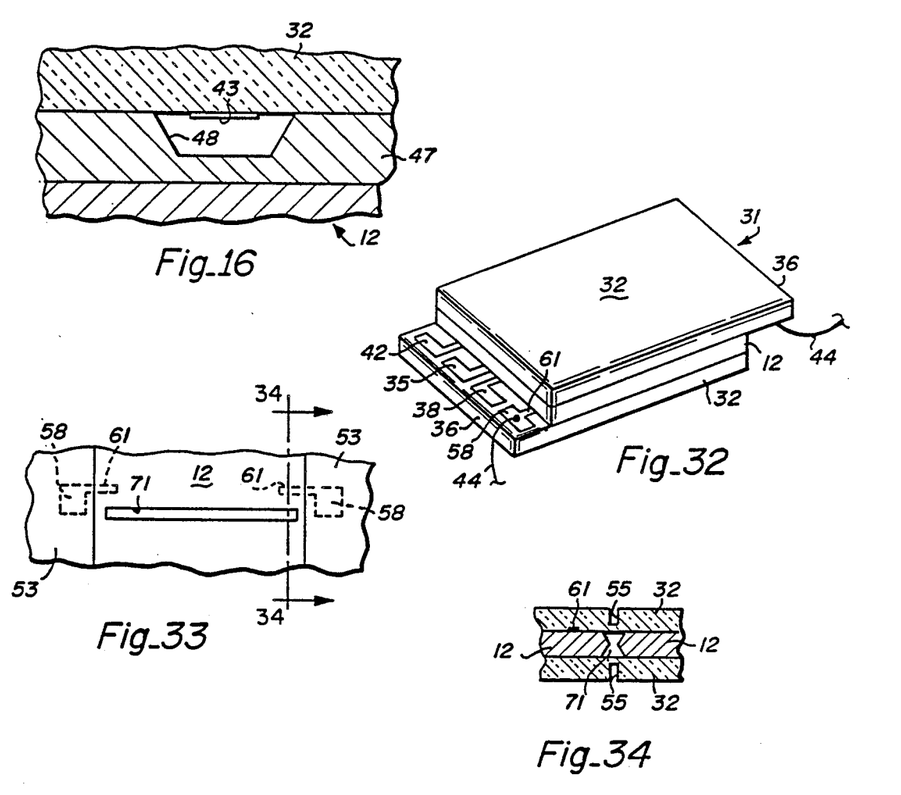
FIG. 16 is an enlarged sectional view of a portion of the structure of FIG. 12 taken along line 16—16 in the direction of the arrows.
FIG. 32 is a perspective view similar to that of FIGS. 13, 22, 23, 25 and 28 depicting an alternative embodiment of the present invention.
FIG. 33 is a view similar to that of FIGS. 24, 26 and 29 depicting the slot patterns for the embodiment of FIG. 32.
FIG. 34 is a sectional view of the structure of FIG. 33 taken along line 34—34 in the direction of the arrows.

Referring now to FIG. 16, there is shown in cross-section the region of the frame 12 through which the lead 43 passes to the contact 42. In this region, the frame 12 is recessed at 48 to provide a gap or space between the inner surface of the lead 43 and the underlaying frame 12. This space, as of 2 to 10 microns in depth, is most conveniently formed during the spacer etch which etches the etch stopped layer 47 to a suitable depth as of 2 to 10 microns in the region overlaying the suspension legs 14 and the central parallel transport structure 13 to define the capacitive gap between the electrodes 33, 37 and 11 and the suspended parallel transport structure 13. The frame 12 is similarly recessed opposite leads 34 and 39.

Although, as thus far described, the parallel transport structures of the present invention have been formed of rectangular geometry by anisotropically etching through (100) major faces of a diamond cubic wafer, the invention is not limited to etching (100), material. As an alternative, the major faces of the wafer may comprise the (110) faces of the wafer. In such a case, the rectangular geometries would be replaced by quadrilateral geometries having included angles of 109.5° and 70.5°, respectively. Also, the sidewalls of the central parallel transport structure 13 and the sidewalls of the frame 12 would be vertical corresponding to the [111] planes.

Referring now to FIGS. 13, 17-20, there is shown a method for assembly of accelerometers 31 of FIGS. 13 in wafer form and then for dicing of the composite wafer structure to provide the individual accelerometer devices 31. More particularly, the wafer 51, as of silicon, which is to be recessed to define the force transducer units 21, is, at the time of recess etching, etched with cleaving slots 28, 52 and 53. The cleaving slots pass entirely through the wafer 51 and are non-intersecting at their ends as previously described with regard to FIG. 11. Slots 53 are made sufficiently wide so as to accommodate the overhanging plate portions 36 of the dielectric plates 32 bearing the electrode structures, as shown in FIG. 12.

The glass plates 32, in addition to the metallization pattern defining the electrodes 33, 37 and 41 of FIG. 11, are also metallized in the regions 54 overlaying the tab portions 27 of the silicon frame 12 with a metal or other material which will prevent formation of a thermoelectric bond between the glass plates 32 and the underlaying tab portions 27. These regions 54 of metallization, in a typical example, comprise a chromium layer deposited upon the glass. As an alternative, the bond-inhibiting material 51 is deposited upon the surfaces of the tab 27 facing the pyrex plates 32 to prevent the bond therebetween.

After the glass plates 32 have been thermoelectrically bonded to the opposed faces of the silicon wafer 51 to form a composite sandwich structure, the glass plate portions 32 of the composite wafer are processed to remove material along cleave lines generally outlining the individual devices which are to be cleaved from the composite wafer. In a typical example, the material of the glass plates 32 is removed along the cleave lines as by sawing or scribing.

The cleave lines are identified at 55 as saw kerfs and they pass only partially through the individual glass plates 32 so as not to introduce contaminants, such as the vehicle of the sawing slurry or particulates contained in the sawing slurry, into the capacitive gaps between the electrodes 33, 37 and 41 and the central mass 13 through the gas communication spaces 48 in the frame 12 which have been formed to accommodate the leads 43, 34 and 39 passing to the various electrodes inside the force transducer unit 31 from the slot region 53 and the overhanging electrical contact pads as carried on the overhanging portions 36 of the dielectric plates 32, (See FIGS. 12 and 16.).

If there are any recesses in the wafer 51 which extend out to and past the perimeter of the plates 32 which have been bonded to the wafer 51 and through which contamination could enter the array of force transducers 31, these recesses are sealed, as by epoxy adhesive, before the composite wafer structure is scribed or sawn along the cleave lines 55. During the sawing operation, the composite wafer structure may be held to the sawing chuck by means of a suitable wax and after the wafer has been sawn along the cleave lines 55, the wax may be removed by conventional solvents in a conventional manner before cleaving begins.

After the composite wafer has been scribed or sawn along the cleave lines 55 and cleaned, it is then ready for cleaving. The individual transducer units 31 are then cleaved from the composite wafer by supporting the composite wafer along a cleaved line with the portion which is to be cleaved from the composite wafer overhanging the support and then the overhanging portion is tapped to cleave the devices from the composite wafer. In the case of the tabs, 27, the composite wafer is first cleaved along cleave lines 55 bordering slots 53 and then the portions over hanging the tabs 27 are cleaved by tapping on the overhanging portions of the glass in a direction away from the tabs 27.

Figure 17:
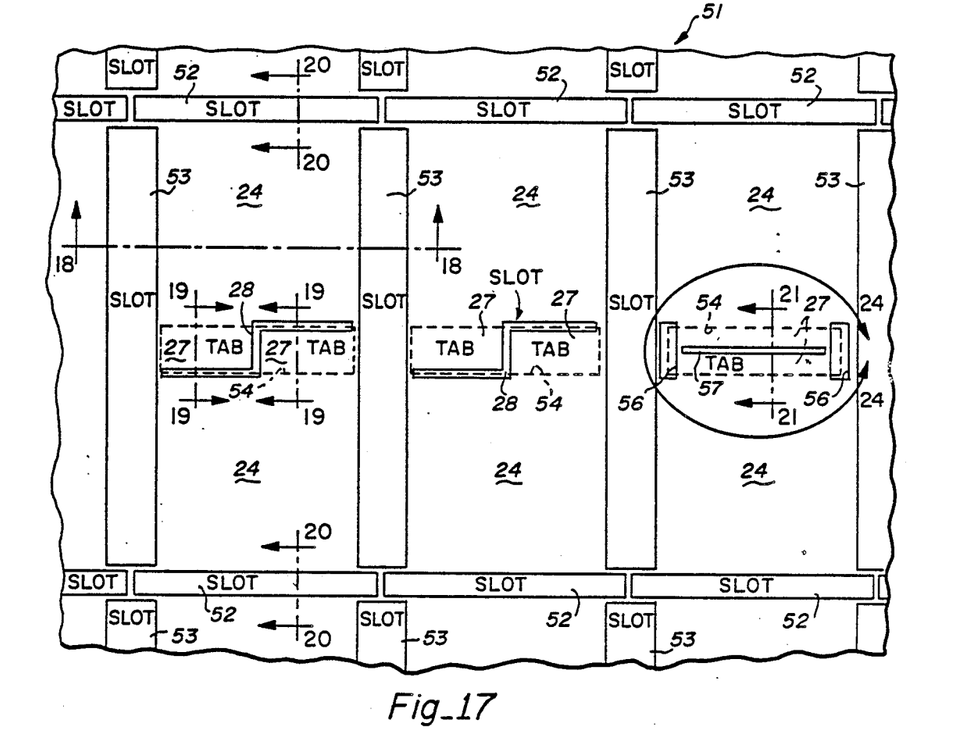
FIG. 17 is an enlarged plan view similar to that of FIG. 9 of a portion of a wafer showing an array of parallel transport structures of the present invention.
Figure 18:
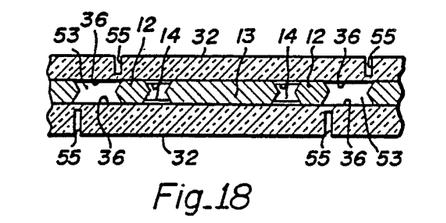
FIG. 18 is a sectional view of a portion of the structure of FIG. 17 taken along line 18—18 in the direction of the arrows.
Figure 19:
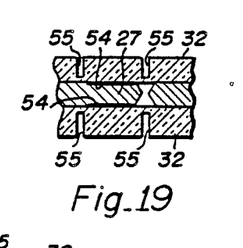
FIG. 19 is a sectional view of a portion of the structure of FIG. 17 taken along line 19—19 in the direction of the arrows.
Figure 20:
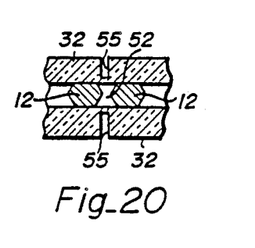
FIG. 20 is a sectional view of the structure of FIG. 17, taken along line 20—20 in the direction of the arrows.
Figure 21:
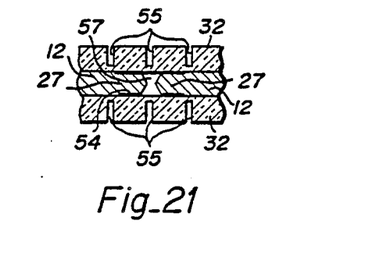
FIG. 21 is a sectional view of the structure of FIG. 17 taken along line 21—21 in the direction of the arrows.
Figure 22:
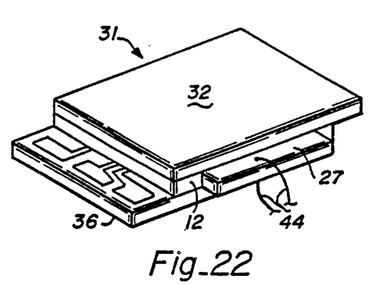
FIG. 22 is a view similar to that of FIG. 13 depicting an alternative embodiment of the present invention.

Referring now to FIGS. 17, 21 and 22, there is shown an alternative embodiment of the present invention wherein the tab portion 27 is not interdigitated with the tab portion 27 of the adjacent transducer unit 24. More particularly, slots 56 are etched through the wafer 51 at opposite ends of an elongated slot 57 which is to define the outer ends of adjacent tab portions 27. Again, the metallization 54 is provided on the glass plates overlaying the tab portions 27 to prevent thermoelectric bonding therebetween. After the composite wafer structure has been bonded together, as previously described with regard to FIG. 18. Then, the devices are cleaved into pairs along transverse slots 52. Then, adjacent devices 21 are cleaved apart along cleave lines 57. After the devices have been separated individually, the portions of the Pyrex plates overlaying the tab portions 27 are cleaved from the tab portions 27 as previously described with regard to FIG. 19.

Figure 23:
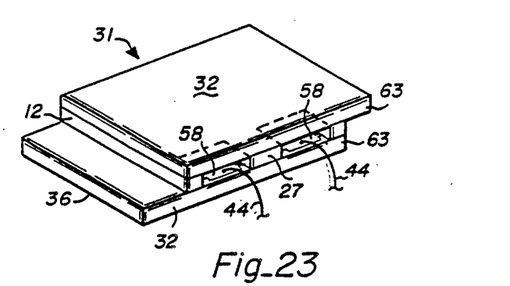
FIG. 23 is a view similar to that of FIG. 22 depicting an alternative embodiment of the present invention.
Figure 24:
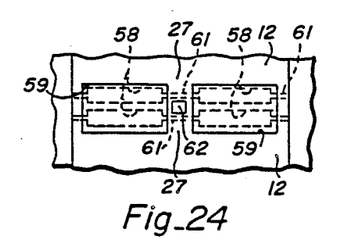
FIG. 24 is a plan view of a slot pattern for the structure of FIG. 23 and similar to that portion of the slot pattern delineated by line 24—24 of FIG. 17.

Referring now to FIG. 23 and 24, there is shown an alternative accelerometer embodiment 31 of the present invention. In this embodiment, electrical contact is made to the tab portion 27 via the intermediary of metallized contact pads 58 provided on both of the glass plates 32 in registration with slots 59 provided in the silicon wafer 12 in registration with the contact pads 58. In addition, the contact pads 58 include a narrow lead portion 61, as of aluminum, overlaying the tab portion 27 of the frame 12. The metallization for the contact pads 58 and the narrow extensions thereof at 61 are made of a material, as of aluminum, which will alloy with the silicon at thermoelectric bonding temperatures as of 450° C. The tab portion 27 is heavily doped, N+ or P+, for making electrical contact to the narrow lead portions 61. During the thermoelectric bonding process, the glass plates 32 are thermoelectrically bonded on both sides of the narrow lead portions 61 to the tab portion 27 for pulling the lead portions 61 into electrical contact with the heavily doped outer surfaces of the tab portion 27. In addition, a slot 62 is provided at the ends of the tab portions 27 in the silicon wafer 12. A single saw kerf 63 is provided in both of the glass plates 32 overlaying slot 62 and slots 59 such that when the transducer devices 31 are cleaved from the composite wafer, the accelerometer structure 31 results. The electrical contact pads 58 with their lead portions 61 are provided in both the top and bottom plates 32 to facilitate making electrical contact to the tab portion 27. Leads 44 are then attached to the pads 58. The advantage of the structure 31 of FIGS. 23 and 24 is that the tab portion 27 is fixedly secured inbetween the glass plates 32 such that it will withstand substatial shock and vibration with fracture. Leads 44 are attached and electrical contact is made to both sets of contact pads on the pyrex plates above and below the tab portion 27.

Figure 25:
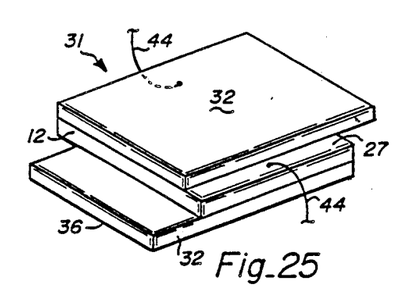
FIG. 25 is a view similar to that of FIG. 22 depicting an alternative embodiment of the present invention.
Figures 26, 27, 29, 30:
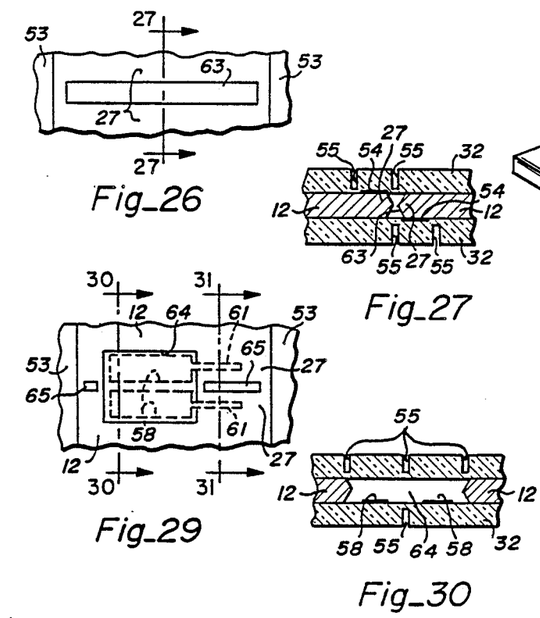
FIG. 26 is a view similar to FIG. 21 depicting the slot pattern for the embodiment of FIG. 25.
FIG. 27 is a sectional view of the structure of FIG. 26 taken along line 27—27 in the direction of the arrows.
FIG. 29 is a view similar to that of FIGS. 24 and 26 depicting the slot pattern for the embodiment of FIG. 28.
FIG. 30 is a sectional view of the structure of FIG. 29 taken along line 30—30 in the direction of the arrows.
Figure 28:
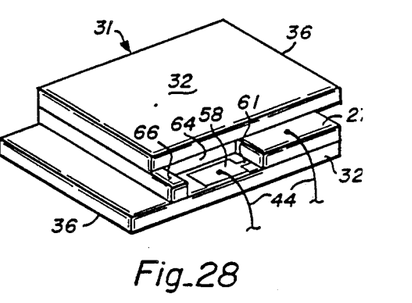
FIG. 28 is a perspective view similar to that of FIG. 25 depicting an alternative embodiment of the present invention.
Figure 31:
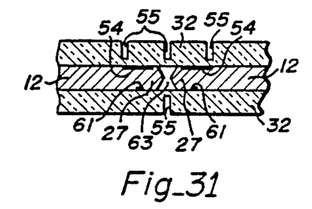
FIG. 31 is a sectional view of the structure of FIG. 29 taken along line 31—31 in the direction of the arrows.

Referring now to FIGS. 25-27, there is shown an alternative embodiment 31 of the present invention. In this embodiment, side slots 53 in the silicon wafer 12 are the same as those previously described with regard to FIGS. 17 and 18 and transverse slots 63 are provided in the silicon wafer at opposite ends of the devices 21, as shown in FIG. 26. The glass plates 32 are metallized with a non-bonding material 54 overlaying the tab portions 27 on only one side of each tab 27 for each force transducer 24 such that the tab portions 27 are thermoelectrically bonded on one side to the overlaying glass plates 32. The devices 31 are cleaved from the composite wafer, in a manner as previously described, along the marginal edges of slots 53 and then cleaved along transverse slots 63. After the individual devices 31 have been cleaved from the composite wafer, the portion of the glass plates 32 overlaying the tab portions 27 are removed as by cleaving to expose the tab portions 27 which are bonded on one side to the pyrex plates 32 and exposed on the opposite side for making electrical contact thereto.

Referring now to FIGS. 28-31, there is shown an alternative force transducer structure 31 incorporating features of the present invention. In this embodiment, enlarged slots 64 are provided in the silicon wafer 12 extending completely through the entire thickness of the wafers with sufficient width to accomodate two contact pads 58 deposited on the underlaying glass plate 32. The contact pads 58 include a narrow lead portion 61 which extends underlaying the heavily doped tab portion 27 of each force transducer structure 21. As in the previous embodiments, contact pads 58 and leads 61 are made of a material which will alloy to the silicon as, for example, aluminum. Additional narrow slots 65 extend through the silicon wafer 12 to facilitate cleaving and defining the tab portions 27.

The uppermost glass plate 32 is metallized with a non-alloying or non-thermoelectrically bonding layer at 54, as of chromium, which overlies the uppermost surface of the tab portions 27 to prevent thermoelectric bonding between the uppermost Pyrex plate 32 and the underlying tab portions 27. Saw kerfs 55 extend laterally inbetween slots 53 in alignment with the narrow slots 65. In addition, additional saw kerfs 55 are provided in the uppermost Pyrex plate extending along the edges of the frame portion 12 and overlaying the root portion of the tab portions 27.

The contact portions 58 make electrical contact to the underside of the tab portions 27 by means of an alloying junction between the aluminum and the silicon and due to the forces pulling the contact leads 61 into alloying relation with the silicon by means of the thermoelectric bond between the tab portion 27 and the non-metallized portion of the glass plates 32.

The individual force transducer structures 31 are cleaved from the composite wafer by cleaving along cleaving slots 55 paralleling the edges of the slots 53 and then the individual transducer devices 31 are cleaved, one from the other, along transverse saw kerfs 55 disposed in registration with slots 65. Then, the tab 27 covering glass plate material is cleaved from the uppermost glass plate 32 in the regions overlaying the tabs 27 and remaining frame portion 66 to produce the resultant structure of FIG. 28. Electrical contact is then made to both sides of the tab 27 via contact pad 58 and a heavily doped portion of tab 27 via leads 44. As in the embodiments of FIG. 23 and 25, the embodiment of 28 has the tab portion 27 bonded on at least one side to a Pyrex plate 32 to make the resultant transducer device 31 more resistant to shock and vibration.

Referring now to FIGS. 32-34, there is shown an alternative embodiment of the present invention. This embodiment is similar to that of FIG. 13 with the exception that the tab portion 27 has been removed and replaced by an electrical contact pad 58 and lead portion 61 on the overhanging portion 36 of the glass plates 32. The lead 61 makes electrical contact to a heavily doped portion of the frame 12. As in the other embodiments, the narrow lead portion 61 is made of a material that will alloy with the silicon at the thermoelectric bonding temperatures of 400°-450° C., such as aluminum. The aluminum contact lead 61 is pulled into contacting relation with the frame 12 by means of a thermoelectric bond on opposite sides of the lead 61.

The silicon wafer 12 includes a transverse non-intersecting slot 71 passing completely through the wafer adjacent the frame portions 12 and saw kerfs 55 are provided along cleave lines in transverse registration with slot 71. Force transducer, structures 31 are cleaved from the composite wafer in the manner as previously described by cleaving along the cleave lines 55 in transverse registration with the edges of the slots 53, as described above with regard to FIG. 18. Then, individual transducers 31 are cleaved apart along the transverse slots 71 to separate the individual devices as shown in FIG. 32.

As an alternative to or as an additive measure to prevent thermoelectric bonding between the tabs 27 and the overlaying glass 32, the tab portions are recessed during the spacer recess step, as by 1-4 μs relative to the frame 12.

The advantage of the batch fabrication method of the present invention, wherein arrays of capacitive force transducer structures are assembled in wafer form and then cleaved from the composite wafer structure along cleave lines, is that such devices are produced by a batch method without introducing contaminants into the capacitive gaps between the devices through the gas communication passageways 48 which accommodate passage for the leads 43, 34 and 19 passing into the electrode structure of the capacitive transducers.

What is claimed is:

1. In a method for making a parallel transport structure having an axis of parallel transport from a wafer of material, the steps of:

selectively etching through both major faces of said wafer into and through the bulk wafer material to define a frame portion of the wafer supporting a central parallel transport structure portion via the intermediary of a plurality of undercut leg portions at both major faces of the wafer and said leg portions bridging between the frame portion and the central parallel transport structure for supporting the central parallel transport structure inbetween leg portions spaced apart along the axis of parallel transport;

said step of selectively etching including selectively removing wafer material from underneath said plurality of leg portions so as to make said leg portions substantially thinner than said frame portion and said parallel transport structure portion with said parallel transport structure portion extending inbetween said leg portions at both major faces of the wafer substantially through the entire thickness of the wafer;

said defined bridging leg portions being defined extending away from the central structure in both major faces of the wafer at an angle from the most direct path to the nearest portion of the supporting frame; and said defined bridging leg portions all extending away from the central parallel transport structure in the same sense of rotation about the axis of parallel transport of the central parallel transport structure.

2. The method of claim 1 wherein the wafer material is diamond cubic crystalline, and forming layers of material on opposite faces of the wafer with different etching properties than that of the bulk diamond cubic wafer material so as to provide etch stopped layers on opposite major faces of the wafer.

3. The method of claim 2 including the step of making the etch stopped layers of diamond cubic crystalline material.

4. The method of claim 2 in which the defined frame is a quadrilateral defined by two pairs of parallel inside walls formed by the [111] crystallographic planes of the crystalline material.

5. The method of claim 2 in which the defined central parallel transport structure is generally a quadrilateral predominantly defined by two pairs of parallel outside walls formed by the [111] crystallographic planes of the bulk diamond cubic material.

6. The method of claim 2 wherein the defined central parallel transport structure includes a ring shaped frame portion the central bulk wafer region of which is etched away by introducing etchant through an array of elongated slots in an etch stopped layer.

7. The method of claim 2 in which the defined central parallel transport structure is suspended from the frame via the intermediary of at least four defined bridging leg portions attached to the central structure.

8. The method of claim 2 in which the defined central parallel transport structure is suspended from the frame via the intermediary of at least sixteen defined bridging leg portions attached to the central structure.

9. The method of claim 7 wherein the defined bridging leg portions are elongated with their longitudinal axes disposed generally parallel to one of the traces of the [111] crystallographic planes on the major faces of the wafer.

10. The method of claim 2 including the step of outlining by etching the defined frame with a plurality of elongated grooves etched into the bulk material of the wafer through slots in the etch stopped layers in transverse registration on opposite major faces of the wafer, making said grooves non-intersecting at their ends so as to leave an unetched connecting support structure at the ends of said grooves interconnecting an array of said frames in the wafer whereby said array of etched frames and parallel transport structures are held together in wafer form.

11. The method of claim 10 including the step of cleaving individual frames and parallel transport structures from the wafer.

12. The method of claim 1 including the step of bonding said frame portion of said parallel transport structure to a dielectric plate having an electrode formed thereon and disposed adjacent and in spaced relation from said parallel transport structure for electric interaction therewith.

13. The method of claim 12 wherein the step of bonding is thermoelectric bonding and including the steps of making said dielectric plate with a plurality of plate-shaped electrodes formed thereon and disposed adjacent in spaced relation overlaying said parallel transport structure for electric interaction therewith, and providing an electrically insulative gap between adjacent plate-shaped electrodes, and recessing said central parallel transport structure in the form of an elongated groove structure disposed in registration with said gap between said plate-shaped electrodes to inhibit electric interaction between the dielectric plate and said parallel transport structure during the step of thermoelectric bonding.

14. The method of claim 1 including the step of bonding the frame portion of said parallel transport structure inbetween a pair of dielectric plates having electrodes formed thereon and disposed adjacent and in spaced relation from said parallel transport structure for electric interaction therewith, and arranging both of said dielectric plates to have portions overhanging different sides of said frame portion of said parallel transport structure to facilitate making electrical contact to said electrodes of said dielectric plates.

15. The method of claim 14 including the step of forming a tab portion of said frame portion and disposing said tab portion overhanging a marginal edge of at least one of said dielectric plates to facilitate making electrical contact to said parallel transport structure.

16. The method of claim 1 wherein the wafer material is fused silica.

17. In a method for making a parallel transport structure having an axis of parallel transport from a wafer of material, the steps of:

selectively etching through at least one major face of said wafer into and through the bulk wafer material to define an array of frame portions of the wafer each supporting a central parallel transport structure portion via the intermediary of a plurality of undercut leg portions bridging between the frame portion and the central parallel transport structure;

forming layers of material on opposite major faces of the wafer with different etching properties than that of the bulk wafer material so as to provide etch stopped layers on opposite major faces of the wafer; and outlining the defined frame portions with a plurality of elongated grooves etched into the bulk material of the wafer through slots in the etch stopped layers on opposite major faces of the wafer, making said grooves non-intersecting at their ends so as to leave an unetched connecting support structure at the ends of said grooves interconnecting an array of said frames in the wafer, whereby said array of etched frames and parallel transport structures are held together in wafer form.

18. In a method for making a parallel transport structure having an axis of parallel transport from a wafer of material, the steps of:

selectively etching into and through the bulk wafer material to define a frame portion of the wafer supporting a central parallel transport structure portion via the intermediary of a plurality of undercut leg portions bridging between the frame portion and the central parallel transport structure;

thermoelectrically bonding said frame portion of said parallel transport structure to a dielectric plate having an electrode formed thereon and disposed adjacent and in spaced relation from said parallel transport structure for electric interaction therewith;

making said dielectric plate with a plurality of plate-shaped electrodes formed thereon and disposed adjacent and in spaced relation overlaying said parallel transport structure for electric interaction therewith;

providing an electrically insulative gap between adjacent plate-shaped electrodes; and recessing said central parallel transport structure in the form of an elongate groove structure disposed in transverse registration with said gap between said plate-shaped electrodes to inhibit electric interaction between the dielectric plate and said parallel transport structure during the step of thermoelectric bonding.

* * * * *